United States Patent [19]
Andreotti

[11] Patent Number: 5,416,326
[45] Date of Patent: May 16, 1995

[54] ANALOG SPATIAL FILTER FOR DETECTION OF UNRESOLVED TARGETS AGAINST A CLOUD-CLUTTERED BACKGROUND

[75] Inventor: John R. Andreotti, Silver Spring, Md.

[73] Assignee: The United States of America as represented by the Secretary of the Navy, Washington, D.C.

[21] Appl. No.: 740,671

[22] Filed: Jun. 3, 1985

[51] Int. Cl.$^6$ .............. H01L 25/00; H01J 40/14; H03B 1/00
[52] U.S. Cl. .............. 250/332; 250/214 B; 250/334; 327/552; 327/557; 327/558
[58] Field of Search .............. 250/214 B, 332, 334; 307/520; 328/167

[56] References Cited

U.S. PATENT DOCUMENTS

| | | |
|---|---|---|
| 3,576,564 | 4/1971 | Galvin .............. 343/7.7 |
| 3,999,137 | 12/1976 | Fucito .............. 328/167 |
| 4,032,857 | 6/1977 | Lum .............. 328/167 |
| 4,218,665 | 8/1980 | Fujisaki .............. 333/165 |
| 4,246,480 | 1/1981 | Clark .............. 250/332 |
| 4,549,312 | 10/1985 | Michaels et al. .............. 328/167 |

*Primary Examiner*—Stephen C. Buczinski
*Attorney, Agent, or Firm*—Jacob Shuster; John G. Wynn

[57] ABSTRACT

A six-pole band-pass filter system and circuit configured for optimal performance in an associated infrared search and track (IRST) system which outputs data in an analog format is disclosed. The key to the successful operation of the filter is its matching to the impulse response of the associated IRST system. By adjusting certain components in the filter, it can operate as an optimal, linear, one-dimensional device to detect unresolved targets against a severely cloud-cluttered background.

6 Claims, 2 Drawing Sheets

ANALOG SPATIAL FILTER FOR DETECTION OF UNRESOLVED TARGETS AGAINST A CLOUD-CLUTTERED BACKGROUND

BACKGROUND OF THE INVENTION

1. Field of the Invention

The present invention relates to signal processing apparatuses and techniques for suppressing cloud-clutter, but more specifically, it relates to an analog spatial filter subsystem and circuit configured for optimal performance of resolving targets against a cloud-cluttered background in an infrared search and track (IRST) system, which outputs data to the analog spatial filter subsystem and circuit in an analog format.

2. Description of the Prior Art

Infrared search and track (IRST) systems that are configured to operate in a sky-search mode need some type of cloud-clutter detection and discrimination capability to be able to resolve targets against a cloud-cluttered background while substantially eliminating false alarms. Considerable work has been done in this area. The results of a theoretical analysis has lead to the concept of the least-mean-square (LMS) spatial filter as one solution to the foregoing problem. In actuality, spatial filters discriminate between unresolved targets and background clutter on the basis of differences in the geometry between the targets and the background clutter. Because the assumptions concerning the nature of the target underlying the use of this class of filters are relatively mild, some form of spatial filter, for example digital, followed by a threshold test is nearly always used as a first level cloud-clutter discriminate.

In the prior art, many independent evaluations of various spatial filters have indicated the superiority of the LMS "filter". However, it must be realized that the LMS "filter" is defined by an impulse response, representing a formal solution to the classical match filter problem for arbitrary noise. In fact, a strict implementation is unrealizable, requiring infinite bandwidth circuits. Most attempts at approximate implementations of the LMS spatial filter have involved digital processing. Unfortunately, these methods require complex and costly hardware to handle the high data rates put out by high resolution IRST systems. Moreover, it is doubtful that digital implementations of the LMS "filter" will be able to handle the high data rates generated by the next generation of fast scan systems.

OBJECTS OF THE INVENTION

Accordingly, an important object of the present invention is to configure an active analog 6-pole bandpass filter so that it can be used in conjunction with an associated infrared search and track (IRST) system, which outputs data in an analog format, to detect unresolved infrared targets against a cloud-cluttered background in an improved manner.

Another object of the present invention is to configure the foregoing band-pass filter so that it is simple in implementation and operation.

A further object of the present invention is to configure the band-pass filter so that it operates much faster than a comparable digital filter (real-time operation), but yet not increase the false alarm rate.

Yet another object of the present invention is to configure the band-pass filter so that its parameters are easily varied to accommodate a change in scan speeds of the associated IRST system.

SUMMARY OF THE INVENTION

The present invention comprises a 6-pole band-pass filter system and circuit configured for optimal performance in an associated infrared search and track (IRST) system which outputs data in an analog format. The essence of the present invention, in the form of an analog spatial filter, and the key to its successful operation, is its matching to the impulse response of an optical subsystem of the associated IRST system. The performance of the band-pass filter system and circuit is determined by varying its resistors, R's, and capacitors, C's, according to predetermined equations. By adjusting these parameters, the filter can operate as an optimal, linear, one-dimensional filter to detect unresolved targets against a severely cloud-cluttered background.

The general architecture of the present filter enables it to constitute an analog implementation of a least-mean-square (LMS) spatial filter whose complex frequency transfer function is:

$$H(s) = s^3 \omega_h / (s + \omega_l)^3 (s + \omega_h)^3,$$

where s is the complex frequency, $$\omega_h = 2\pi(1.2/T),$$

and $$\omega_l = 2\pi(0.8/T).$$

T is equal to the maximum pulse width (point response function) of the associated IRST system.

BRIEF DESCRIPTION OF THE DRAWINGS

The previously stated objects, other objects, features and advantages of the present invention will be apparent from the following more particular description of the preferred embodiment as illustrated in the accompanying drawings, in which.

DESCRIPTION OF THE PREFERRED EMBODIMENT

Figure 1:
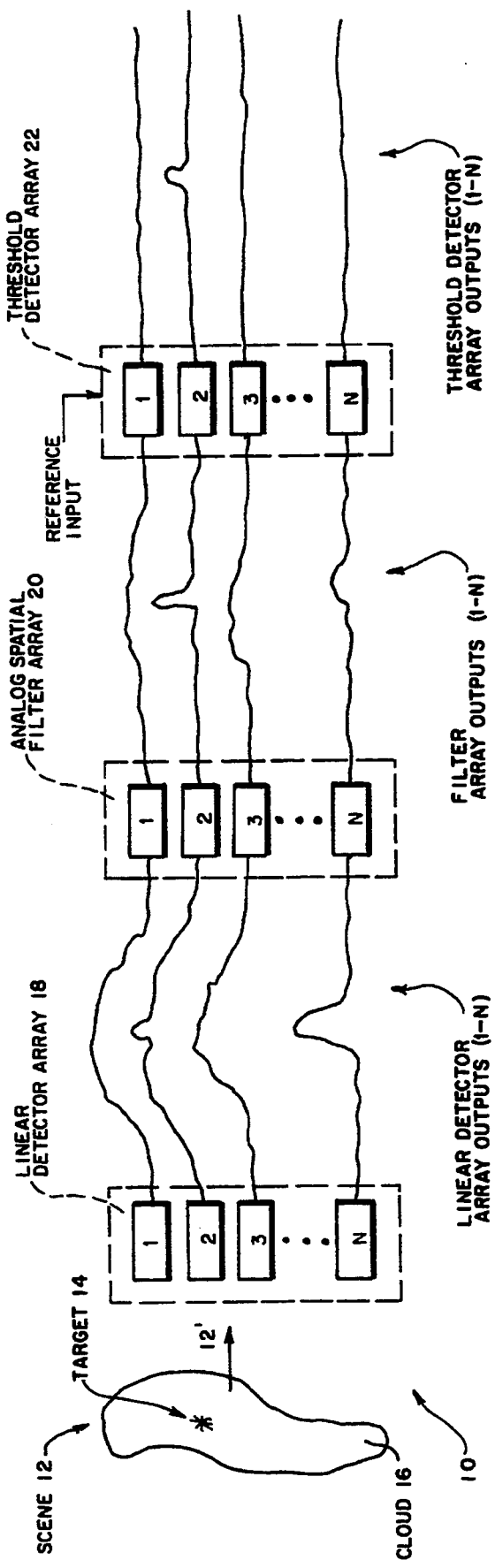
FIG. 1 is a schematic representation of a system and circumstance employing, inter alia, an analog spatial filter array according to the present invention.

FIG. 1, depicts a typical system and circumstance 10 in which the present invention is employed to detect point targets against a cloud-cluttered background. As shown, the circumstance portion of the system and circumstance 10 includes a scene 12 having a point target 14 in the vicinity of a cloud (clutter) 16. The system portion of the system and circumstance 10 comprises a linear detector array 18 which is normally a part of an associated infrared search and track (IRST) system (not shown). The associated IRST system generally includes an optical subsystem (also not shown) which scans the scene 12 and focuses it on the stationary linear detector array 18. Thus, the scene 12 is moved across the linear detector array 18 in the direction indicated by a scene directional arrow 12'. The linear detector array 18 comprises N separate linear detectors, where N for a typical system numbers 60.

To continue, the system portion of the system and circumstance 10 further comprises an analog spatial filter array 20 encompassing the present invention, and a threshold detector array 22. The reference input of the threshold detector array 22 can be driven by an adaptive reference voltage which can be varied as a function of the overall contrast of the scene 12. In this case, each of the threshold detectors of the threshold detector array 22 is driven by its own reference voltage (peak detectors could be used to generate the foregoing reference voltages). In the alternative, a constant reference voltage can be generated and applied in common to all of the threshold detectors of the threshold detector array 22. Normally this reference voltage or level is found, in practice, by setting the level with no scene to give a single false alarm or indication. Also, for the analog spatial filter array 20 and the threshold detector array 22, there are N separate analog spatial filters and threshold detectors, respectively, which correpond to the N separate linear detectors of the linear detector array 18, aforementioned.

Figure 2:
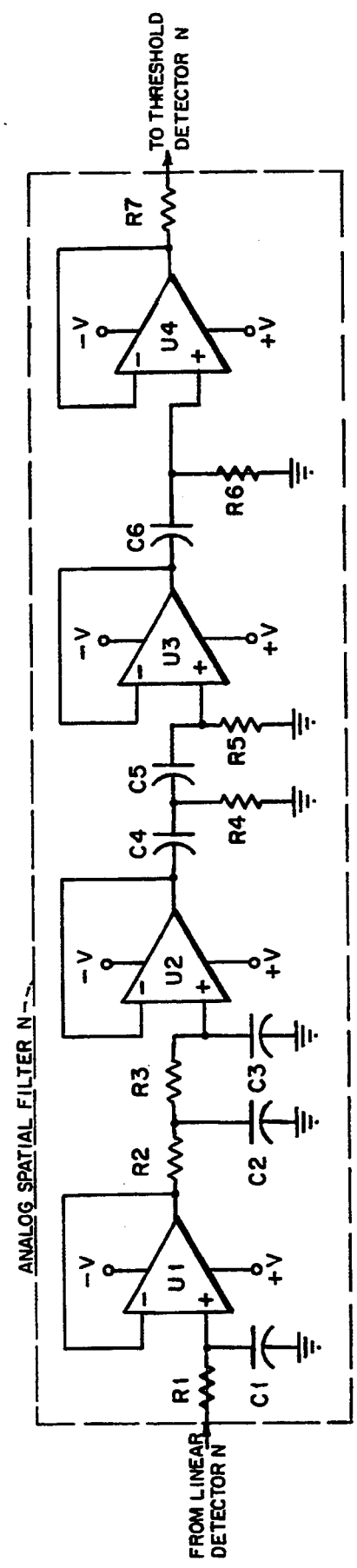
FIG. 2 is a schematic diagram of one implementation of the analog spatial filter(s) of FIG. 1.

Referring now to FIG. 2, the circuit topography suitable for implementation of anyone of the analog spatial filters 1−N of the analog spatial filter array 22, of FIG. 1, is shown. A particular analog spatial filter N is implemented as a six-pole band-pass filter configured for optimal performance in the associated IRST system, as long as it outputs data in an analog format. The essence of the successful performance of the present invention, in the form of the analog spatial filter N, is its matching to the impulse response of an optical subsystem of the associated IRST system. The performance of the analog spatial filter N is determined by the successful adjustment of the values of the resistors, in the form of R1, R2, R3, R4, R5, R6, and R7 and the values of the capacitors, in the form of C1, C2, C3, C4, C5, and C6 to create the foregoing matching. The values are computed according to predetermined equations which have been optimized by a computer simulation. The computer simulation involved the use of actual cloud-clutter data and synthesized point targets of varying contrast.

STATEMENT OF THE OPERATION

Referring now to FIGS. 1 and 2, as viewed concurrently, the operation of the present invention and particular aspects of its implementation, according to predetermined equations, are discussed hereinbelow.

As previously noted, the present invention, in the form of the analog spatial filter array 20, operates as an integral part of the associated IRST system, and is designed to detect unresolved targets such as the point target 14 against intense clutter such as the cloud 16. Its function in the IRST system is indicated in FIG. 1. As also previously noted, the scene 12 acts, as indicated by the scene directional arrow 12', as if it were translated across the linear detector array 18. This results in an analog voltage output for each channel or detector, as labeled by the linear detector array outputs 1−N. These outputs are, in turn, fed into corresponding ones of the analog spatial filter array 20. The resulting outputs, labeled as the filter array outputs 1−N, indicate the relative attenuation of the clutter relative to the target response (see channel 2, for example). The presence of a target is revealed by the operation of the threshold detector array 22, as clearly shown at the output of the threshold detector 2.

The general architecture of the analog spatial filter N is best defined by its complex frequency transfer function, which is:

$$H(s) = s^3 \omega_h / (s+\omega_l)^3 (s+\omega_h)^3,$$

where s is the complex frequency, $\omega_l$ is the lower −9 db radian frequency, and $\omega_h$ is the upper −9 db radian frequency. The choice of parameters for the circuit of FIG. 2 is determined by the following equations:

$$\omega_h = 2\pi f_h = 2\pi(1.2/T) = 1/R1C1 = 1/R2C2 = 1/R3C3,$$

and $$\omega_l = 2\pi f_l = 2\pi(0.8/T) = 1/R4C4 = 1/R5C5 = 1/R6C6,$$

$$R1 = R3 = 10R2,$$

and $$R5 = R6 = 10R4.$$

The equations defining the resistor relationships indicate the requirement to decouple the adjacent poles created by the relationships expressed in the first two equations. Actual values of the resistors are based on practical input and output impedance limitations on the operational amplifiers U1, U2, U3, and U4, and the desirability that they be low in cost. In the first two equations, typical values of the maximum pulse width T of the optical subsystem (not shown) range from 10 $\mu$sec to 1 msec. The maximum pulse width T for a typical system, as depicted in FIG. 1, is a function of the scan speed, as indicated by the scan arrow 12', and the dimension of the linear detector array 18 in the scan direction.

Still referring to FIG. 2, for a maximum pulse width T of 60 $\mu$sec, typical values of circuit elements for the analog spatial filter N are as follows:

| | |
|---|---|
| Resistors R1, R3, R5, and R6, | 10 kilohm, |
| Resistors R2, R4, and R7, | 1 kilohm, |
| Capacitors C1 and C3, | 800 picofarad, |
| Capacitors C2, | 8,000 picofarad, |
| Capacitors C4, | 12,000 picofarad, |
| Capacitors C5 and C6, | 1,200 picofarad |

In addition, it should be mentioned that for purposes of the present invention, each of the operational amplifiers U1, U2, U3, and U4 is one of four sections of the quad operational amplifier type LF347, which is marketed by several semiconductor companies under this designation.

As shown in FIG. 2, the analog spatial filter N comprises three low-pass fitlers (R1C1, R2C2 and R3C3) having the same low-frequency cut-off point, and three high-pass filters (R4C4, R5C5 and R6C6) having the same high-frequency cut-off point.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An improved infrared search and track (IRST) system of the type having an optical subsystem for scanning a scene consisting of one or more point targets in the vicinity of one or more clouds (clutter), and having a stationary linear detector array of N separate linear detectors thereby creating N separate channels, said optical subsystem operating to translate the scene across said stationary linear detector array resulting in an analog voltage output for each channel, wherein the improvement comprises:

an analog spatial filter array having N separate analog spatial filters each being operatively connected to corresponding ones of said stationary linear detector array of said IRST system such that the analog voltage outputs therefrom are fed into corresponding individual ones of said analog spatial filter array, said individual ones of said analog spatial filter array being configured to filter-out broad spatial features of the scene such as the one or more clouds (clutter) and enhance point-like spatial features of the scene such as the one or more point targets thereby attenuating the one or more clouds (clutter) relative to the one or more point targets;

a threshold detector array having N separate threshold detectors each being operatively connected to corresponding ones of said analog spatial filter array, said threshold detector array including a reference input for applying a reference voltage that is a measure of the contrast of the one or more point targets such that the presence of a target relative to a cloud is detected, the configuration of each one of said analog spatial filters being defined by its complex frequency transfer function, H(s) which is:

$$H(s) = s^3 \omega_h/(s+\omega_l)^3(s+\omega_h)^3,$$

where s is the complex frequency, $\omega_l$ is the lower $-9$ db radian frequency, and $\omega_h$ is the upper $-9$ db radian frequency.

2. The improved IRST system of claim 1 wherein said filter has a first, second, and third low-pass filter sections which respectively have a first, second and third poles having the same locus in a complex frequency plane.

3. The improved IRST system of claim 2 wherein said filter has a fourth, fifth, and sixth high-pass filter sections which respectfully have a fourth, fifth and sixth poles having the same locus in a complex frequency plane.

4. An improved analog spatial filter defined by its complex frequency transfer function, H(s) which is:

$$H(s) = s^3 \omega_h/(s+\omega_l)^3(s+\omega_h)^3,$$

where s is the complex frequency, $\omega_l$ is the lower $-9$ db radian frequency, and $\omega_h$ is the upper $-9$ db radian frequency.

5. The improved analog spatial filter of claim 4 wherein said filter has a first, second, and third low-pass filter sections which respectively have a first, second and third poles having the same locus in a complex frequency plane.

6. The improved analog spatial filter of claim 5 wherein said filter has a fourth, fifth, and sixth high-pass filter sections which respectively have a fourth, fifth and sixth poles having the same locus in a complex frequency plane.

* * * * *